(12) United States Patent
Athas et al.

(10) Patent No.: US 6,867,631 B1
(45) Date of Patent: Mar. 15, 2005

(54) SYNCHRONOUS FREQUENCY CONVERTOR FOR TIMEBASE SIGNAL GENERATION

(75) Inventors: William C. Athas, San Jose, CA (US); Keith A. Cox, Campbell, CA (US)

(73) Assignee: Apple Computer, Inc., Cupertino, CA (US)

( * ) Notice: Subject to any disclaimer, the term of this patent is extended or adjusted under 35 U.S.C. 154(b) by 0 days.

(21) Appl. No.: 10/418,622

(22) Filed: Apr. 18, 2003

(51) Int. Cl.$^7$ .............................................. H03K 3/00
(52) U.S. Cl. ...................................... 327/291; 327/113
(58) Field of Search ................................ 327/291, 294, 327/298, 233, 231, 218, 113, 105

(56) References Cited

U.S. PATENT DOCUMENTS

| | | | | |
|---|---|---|---|---|
| 5,175,453 A | * | 12/1992 | Chang et al. | 327/276 |
| 5,633,607 A | * | 5/1997 | Millar | 327/217 |
| 5,708,381 A | * | 1/1998 | Higashisaka | 327/276 |

* cited by examiner

Primary Examiner—Linh My Nguyen
(74) Attorney, Agent, or Firm—Blakely, Sokoloff, Taylor & Zafman LLP

(57) ABSTRACT

Methods and apparatuses for generating a synchronous digital output signal stream from two digital input signal streams. In one aspect of the present invention, a method to generate a digital output signal stream from two digital input signal streams includes: detecting a first transition edge in a first digital input signal stream; and generating a third transition edge in a digital output signal stream. The third transition edge corresponds to the first transition edge; and the third transition edge is synchronized substantially with a second transition edge in a second digital input signal stream. In one example according to this aspect, a third digital signal stream is generated from synchronizing substantially transition edges of the first digital input signal stream with transition edges of the second digital input signal streams; and the first transition edge is detected using the third digital signal stream (e.g., comparing the third digital signal stream with a delayed version of the third digital signal stream).

24 Claims, 8 Drawing Sheets

SYNCHRONOUS FREQUENCY CONVERTOR FOR TIMEBASE SIGNAL GENERATION

FIELD OF THE INVENTION

The invention relates to digital clock signal generation, and more particularly to generating a synchronous digital signal stream from two digital input signal streams.

BACKGROUND OF THE INVENTION

Microprocessor real-time clock circuitry is controlled by a timebase enable signal that is synchronized with the bus clock signal. In a traditional bus, a timebase enable signal has a fixed relationship with the bus clock signal. Thus, a timebase enable signal is typically generated from the bus clock by removing periodically certain numbers of pulses from the bus clock. The timebase enable signal has pulses in a frequency that is proportional to the frequency of the bus clock signal; and the rising (or falling) transition edges of the pulses of the timebase signal are synchronized with the bus clock signal.

However, when a new, state-of-art bus is used, such fixed relationship may not exist. In a state-of-art bus, the frequency of the bus clock can be changed. However, the frequency of timebase enable signal cannot be changed to maintain an accurate real-time clock. Thus, the frequency relationship between the bus clock and the timebase enable signal is not fixed in such a bus.

SUMMARY OF THE INVENTION

Methods and apparatuses for generating a synchronous digital output signal stream from two digital input signal streams are described here.

In one aspect of the present invention, a method to generate a digital output signal stream from two digital input signal streams includes: detecting a first transition edge in a first digital input signal stream; and generating a third transition edge in a digital output signal stream. The third transition edge corresponds to the first transition edge; and the third transition edge is synchronized substantially with a second transition edge in a second digital input signal stream.

In one example according to this aspect, a third digital signal stream is generated from synchronizing substantially transition edges of the first digital input signal stream with transition edges of the second digital input signal streams; and the first transition edge is detected using the third digital signal stream (e.g., comparing the third digital signal stream with a delayed version of the third digital signal stream).

In one example according to this aspect, a fourth transition edge is generated in the digital output signal stream after the third transition edge to form a pulse delimited by the third and fourth transition edges. A first time period between the third and fourth transition edges is determined from a second time period between two transition edges in the second digital input signal stream. In one example, the second digital input signal stream is periodic; and the first time period is multiple times a period of the second digital input signal stream.

In one example according to this aspect, a fourth transition edge in the first digital input signal stream is detected; and a sixth transition edge is generate in the digital output signal stream. The sixth transition edge corresponds to the fourth transition edge; and the sixth transition edge is synchronized substantially with the fifth transition edge in the second digital input signal stream. The second and fifth transition edges are one of: a) rising edges; and b) falling edges. The first and fourth transition edges are one of: a) consecutive rising edges; b) consecutive falling edges; and c) consecutive transition edges.

In one example according to this aspect, the digital output signal stream is a timebase enable signal, which has a frequency determined from the frequency of the first digital input signal; and the frequency of the second digital input signal is higher than the frequency of the first digital input signal.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follow.

BRIEF DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention.

Figure 1:
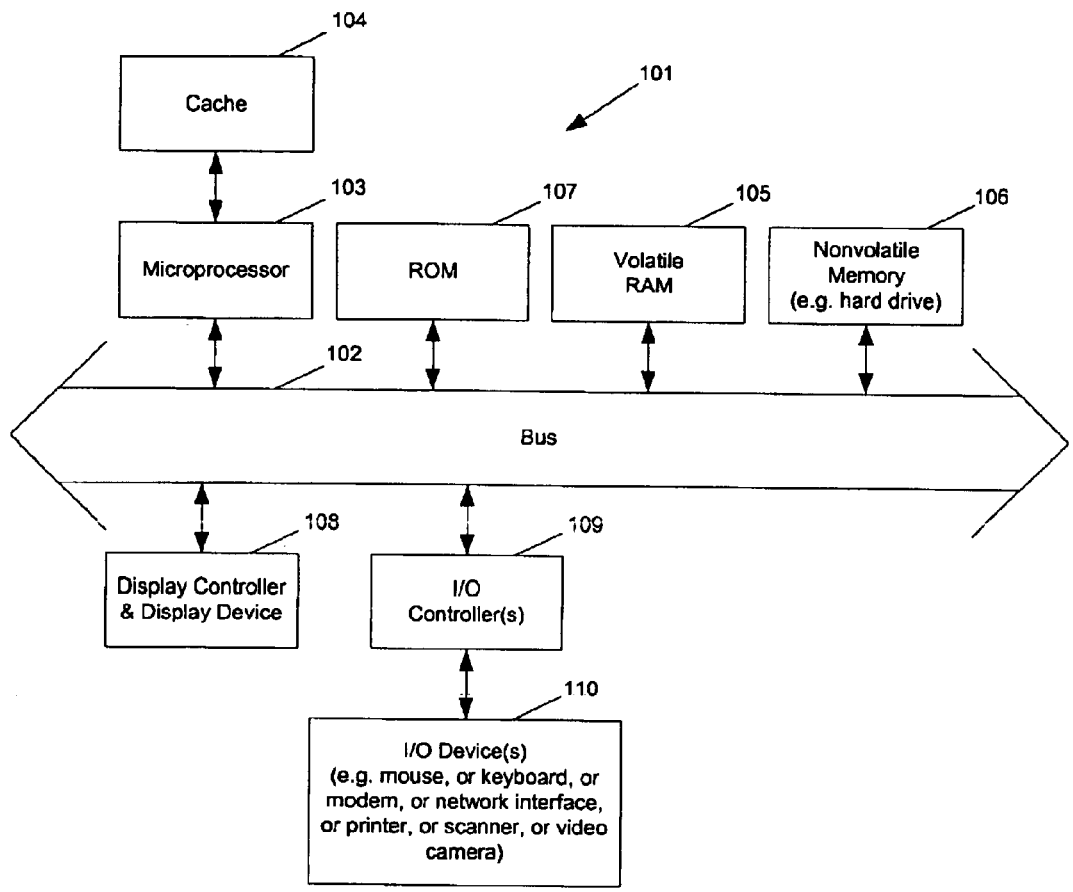
FIG. 1 shows a block diagram example of a data processing system in which a frequency convertor according to one embodiment of the present invention may be used.

FIG. 1 shows a block diagram example of a data processing system in which a frequency convertor according to one embodiment of the present invention may be used. Note that while FIG. 1 illustrates various components of a computer system, it is not intended to represent any particular architecture or manner of interconnecting the components as su ch details are not germane to the present invention. It will also be appreciated that network computers and other data processing systems which have fewer components or perhaps more components may also be used with the present invention. The computer system of FIG. 1 may, for example, be an Apple Macintosh computer.

As shown in FIG. 1, the computer system 101, which is a form of a data processing system, includes a bus 102 which is coupled to a microprocessor 103 and a ROM 107 and volatile RAM 105 and a non-volatile memory 106. The microprocessor 103, which may be a G3 or G4 microprocessor from Motorola Inc. or IBM is coupled to cache memory 104 as shown in the example of FIG. 1. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 10 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable media can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 1. Portions of this software and/or data may be stored in any one of these storage devices.

Thus, a machine readable media includes any mechanism that provides (i.e., stores and/or transmits) information in a form accessible by a machine (e.g., a computer, network device, personal digital assistant, manufacturing tool, any device with a set of one or more processors, etc.). For example, a machine readable media includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

Figure 2:
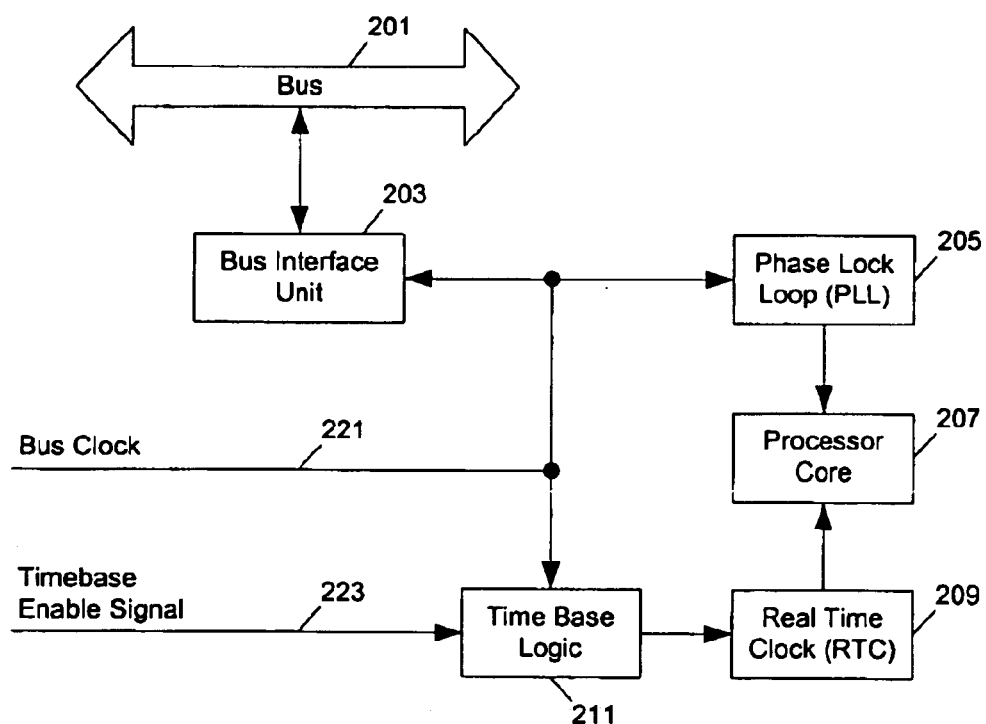
FIG. 2 shows a block diagram example of a digital processing system using a synchronous timebase enable signal.

FIG. 2 shows a block diagram example of a digital processing system using a synchronous timebase enable signal. The bus clock on line 221 controls the communication between bus interface unit 203 and bus 201. Phase Lock Loop (PLL) 205 generates a high frequency clock signal for processor core 207; and time base logic 211 uses timebase enable signal (223) and bus clock signal (221) to drive real time clock (RTC) 209, which may be used by processor core 207 to determine the real time. The timebase enable signal is synchronized with the bus clock signal; and the timebase enable signal has a predetermined frequency so that it can drive the real time clock accurately. When the frequency of the bus clock is also predetermined, there is a fixed relation in frequency between the timebase enable signal and bus clock. Thus, the timebase enable can be simply generated from the bus clock.

However, in a state-of-art bus design, the frequency of the bus clock can be changed. The frequency of the system may be increased to improve performance or reduced to conserve power. If the timebase enable signal is generated from the bus clock using a fixed frequency relationship, the frequency of the timebase enable signal changes as the frequency of the bus clock changes. When the frequency of the timebase enable signal changes, the real time clock will run faster or slower than a standard clock, which is not a desirable side effect. Thus, it is necessary to generate a timebase enable signal that is synchronized with the bus clock, but may not have a fixed frequency relationship with the bus clock.

Figure 3:
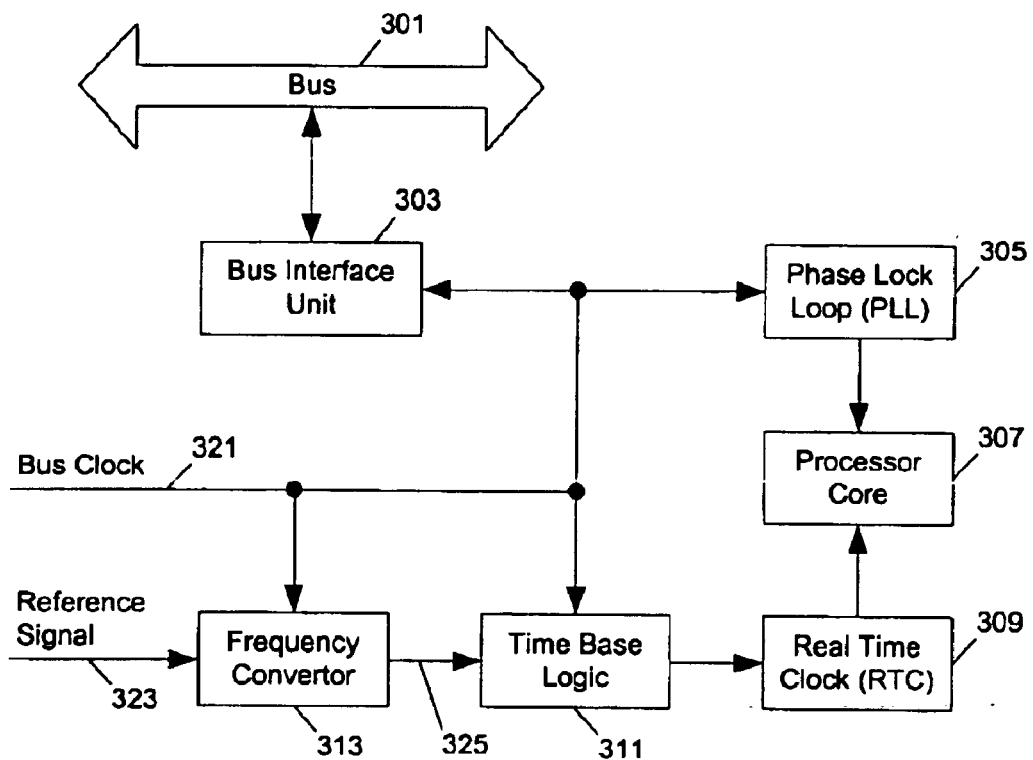
FIG. 3 shows a block diagram example of a system with a synchronous timebase enable signal generated from an independent reference signal and a bus clock signal according to one embodiment of the present invention.

FIG. 3 shows a block diagram example of a system with a synchronous timebase enable signal generated from an independent reference signal and a bus clock signal according to one embodiment of the present invention. Reference signal 323 has a desirable and constant frequency for driving time base logic 311. Frequency convertor 313 synchronizes the reference signal (323) with the bus clock (321) to generate a timebase enable signal on line 325. The frequency of the timebase enable signal is determined from the reference signal; and the timing of the pulses of the timebase enable signal are synchronized to the rising or falling edges of the bus clock signal. Since the frequency of the timebase enable signal is determined from the frequency of the reference signal, which is independent on the frequency of the bus clock, the timebase enable signal generated by frequency convertor 313 will remain the same if the frequency of the bus clock changes. Thus, the timebase enable signal can always maintain a proper relationship with the bus clock even if the frequency of the bus clock may change.

Once the timebase enable signal (325) is generated from the reference signal (323) and the bus clock (321), the same system as shown in FIG. 2 can be used. The bus clock on line 321 controls the communication between bus interface unit 303 and bus 301. Phase Lock Loop (PLL) 305 generates a high frequency clock signal for processor core 307; and time base logic 311 uses timebase enable signal (325) and bus clock signal (321) to drive real time clock (RTC) 309, which may be used by processor core 307 to determine a real time.

Although FIG. 3 shows an example where the timebase enable signal is generated from the bus clock signal and a reference signal, it is understood that the timebase enable signal can be generated from any readily available high frequency system signal that is synchronized with the bus clock signal.

Figure 4:
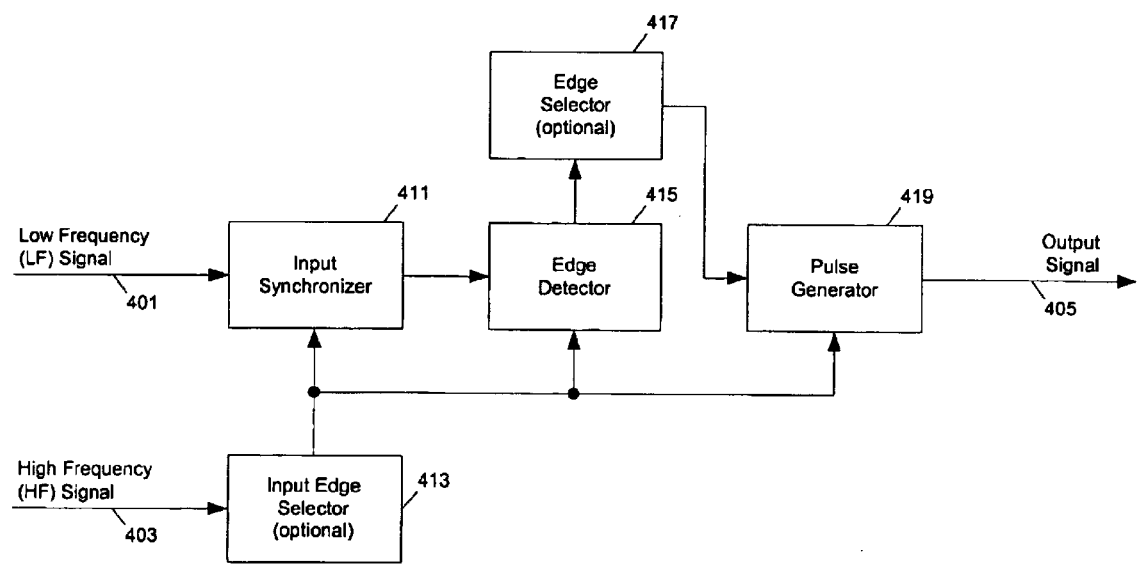
FIG. 4 shows a block diagram example of a synchronous frequency convertor according to one embodiment of the present invention.

FIG. 4 shows a block diagram example of a synchronous frequency convertor according to one embodiment of the present invention. The frequency convertor includes an optional input edge selector 413 for selecting either the rising edge or the falling edge of the High Frequency (HF) signal for purpose of synchronization. Input synchronizer 411 adjusts the timing of the rising and (or) falling edge of the Low Frequency (LF) signal so that they are synchronized to the HF signal. Edge detector 415 detects the transition edges of the signal generated by input synchronizer 411; and optional edge selector 417 determines the edge (e.g., a rising edge, a falling edge, or both) for which a pulse is generated. Pulse generator 419 generates a pulse of a predetermined width for each of the edges detected and selected by edge detector 415 and edge selector 417. The edge selected by optional input edge selector 413 controls the operations of input synchronizer 411, edge detector 415, and pulse generator 419 so that the output signal (405) has a frequency determined by the LF signal (401) and transition edges synchronized with the HF signal (403).

Figure 5:
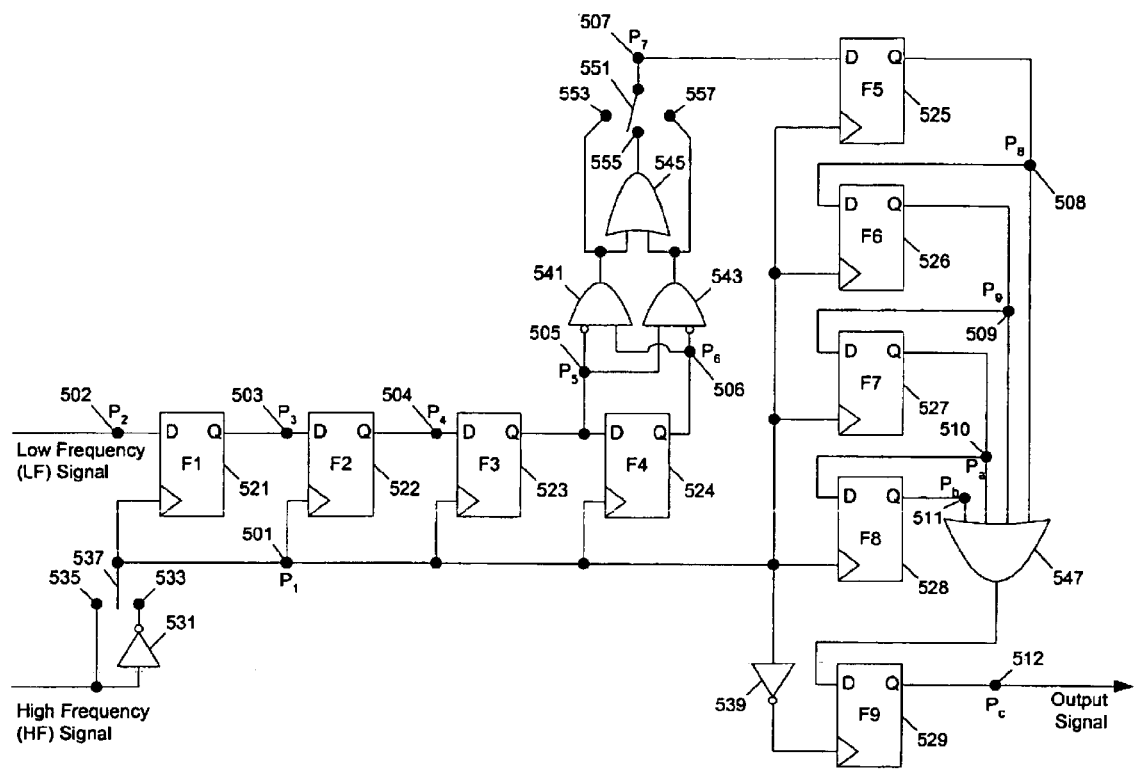
FIG. 5 shows a schematic diagram example of a synchronous frequency convertor according to one embodiment of the present invention.

FIG. 5 shows a schematic diagram example of a synchronous frequency convertor according to one embodiment of the present invention. Switch 537 and invertor 531 form an input edge selector. When switch 537 is on position 535, the rising edges of HF signal are used for synchronization; and when switch 537 is on position 533, the falling edges of HF signal are used for synchronization.

Flip-flops F1–F3 (521–523) form an input synchronizer to adjust the timing of the rising and/or falling edge of the Low Frequency (LF) signal so that they are synchronized to the transition edge of the HF signal determined by the input edge selector. Because the rising and falling edge of the LF signal can occur at any time relative to the rising (or falling, if switch 537 is on position 533) edge of the HF signal, it is possible that flip-flop F1 may fail to properly synchronize the LF signal to the rising edges of the signal on line 501 and may produces invalid outputs with a small probability. Flip-flop F2 further seeks to synchronize the LF signal with the rising edges of the signal on line 501 and decrease the overall probability of producing an invalid output. Since cascaded flip-flops F1 and F2 may still have a small probability for producing an invalid output, flip-flop F3 may be used to further reduce the overall probability of producing an invalid output. Thus, cascading a number of flip-flops in the input synchronizer exponentially reduces the probability of producing an invalid output. Although three flip-flops are shown in the example in FIG. 5, it will be understood that a different number of flip-flops can be cascaded in the input synchronizer. The more flip-flops cascaded in the input synchronizer, the smaller is the probability of producing an invalid output.

Flip-flop F4 (524) and logic units 541–545 form an edge detector. Flip-flop F4 generates (on line 506) a delayed version of the signal generated by the input synchronizer (on line 505). By comparing the delayed version of the signal (506) and the signal (505) generated by the input synchronizer, the rising or falling edges of the LF signal can be detected. Gate 543 produces a pulse for the rising edge; gate 541 produces a pulse for the falling edge; and gate 545 produces a pulse for each transition edge (rising and falling).

Switch 551 forms an edge selector. When switch 551 is at position 553, the frequency convertor generates a pulse for each falling edge of the LF signal; when switch 551 is at position 555, the frequency convertor generates a pulse for each transition edge (rising or falling) of the LF signal; and when switch 551 is at position 557, the frequency convertor generates a pulse for each rising edge of the LF signal.

Flip-flops F5–F8 (526–528), gate 547, invertor 539 and flip-flop F9 (529) form a pulse generator. The width of the pulse selected by switch 551 is adjusted to a predetermined size. Flip-flops F5–F8 form a "one-hot code" counter in which an output pulse from switch 551 is shifted through the flip-flops in 4 cycles. Thus, the pulse generator widens the pulse from switch 551 to a time period that is 4 times the period of the HF signal. Since unnecessary transitions may be detected by gate 547 when the pulse is shifted from one flip-flop to another, flip-flop 529 is used to smooth out the output pulse so that one pulse from switch 551 is widened into only one pulse of a predetermined size. Although the example in FIG. 5 uses 4 flip-flops (525–528) to widen the pulse to a time period that is 4 times the period of the HF signal, it will be understood that a different number of flip-flops can be used to widen or shorten the pulse to a different size. Further, the width of the output pulse can be adjusted to different sizes using various means (e.g, counters) well known in the art. A pulse generator may also accept one or more signals for selecting (or specifying) a desirable pulse width.

Figure 6:
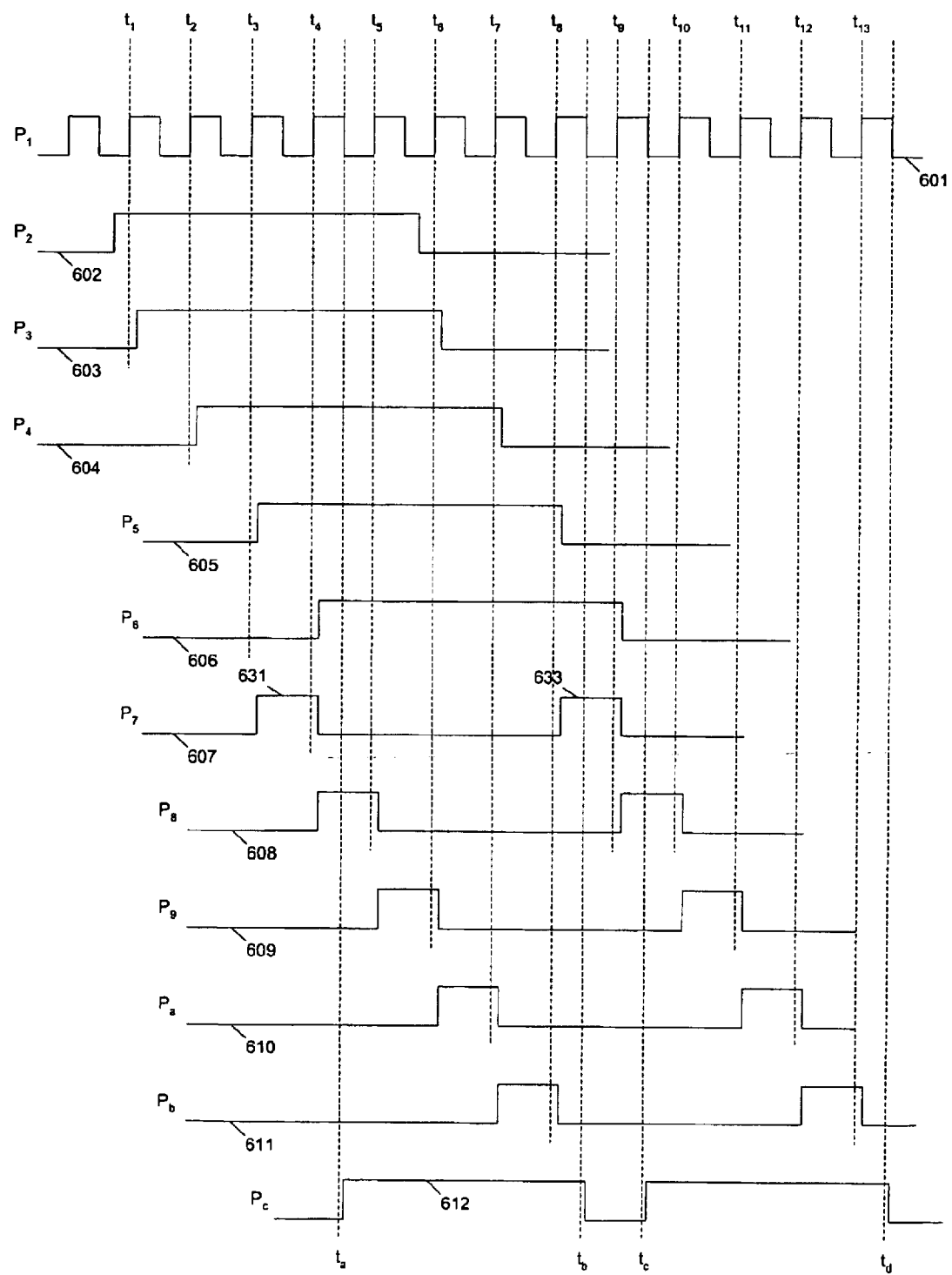
FIG. 6 illustrates waveforms in a synchronous frequency convertor according to one embodiment of the present invention.

FIG. 6 illustrates waveforms in a synchronous frequency convertor as shown in FIG. 5. Signal 601 at point P1 (501 in FIG. 5) is the same as the input HF signal, assuming that switch 537 is at position 535. Signal 602 at point $P_2$ (502) represents the input LF signal. Waveforms 603–612 correspond to the signals at points $P_3$–$P_{12}$ (503–512 in FIG. 5). Waveform 603 shows that the rising and falling edges of the LF signal 602 is adjusted to be substantially synchronized to the rising edges of the HF signal (601). A small delay in waveform 603 due to the processing time of flip-flop F1 (521) can also be seen at time $t_1$ and time $t_6$. Waveforms 604 and 605 correspond to the output of flip-flops F2 and F3 (522 and 523), which further adjust the timing of the transition edges to synchronize the transition edges with the rising edges of HF signal 601. Flip-flop F4 (524) generates waveform 606, which is a delayed version of waveform 605. When waveforms 605 and 605 are compared to each other (by logic units 541–545), transition edges are detected. Assuming that switch 551 is at position 555, both rising and falling edges are detected. Thus, pulse 631 is generated, corresponding to the rising edges at near time $t_1$ in the LF signal; and pulse 633 is generated, corresponding to the falling edges at near time $t_6$ in the LF signal. Flip-flops F5–F8 (525–528) shift the waveform 607 to generate outputs 608–611. OR gate 547 and flip-flop F9 (529) combine waveforms 608–611 into waveform 612. Since waveforms 608 and 609 transit simultaneously at time $t_5$, the output of OR gate 547 may have uncertainty at time $t_5$. Flip-flip F9 (529) removes such uncertainty so that the output pulse 612 has a width of four times the period of HF signal 601. The rising and falling edges (e.g., at times $t_a$, $t_b$) of output signal 612 are substantially synchronized with the falling edge of HF signal 601 with only a small delay due to the processing time of flip-flop F9 (529).

Figure 7:
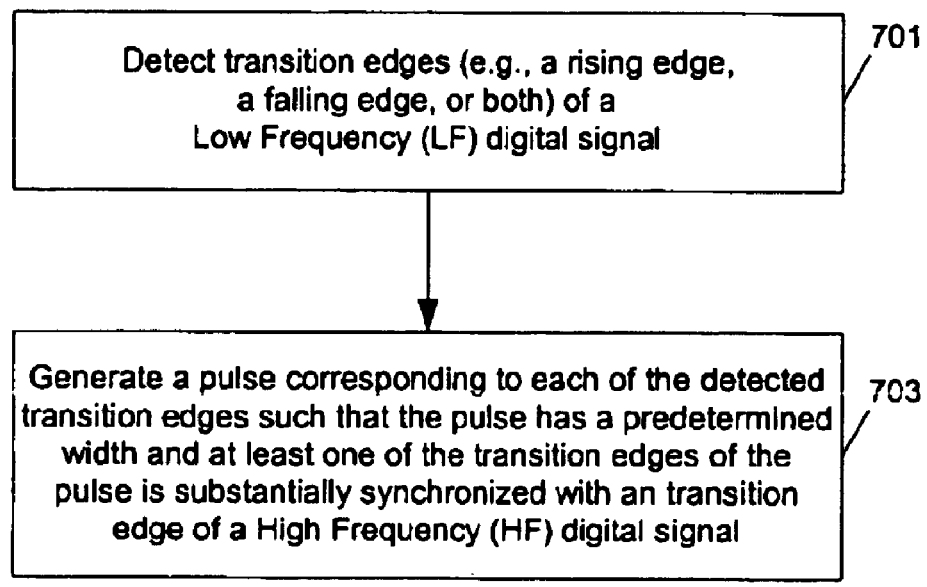
FIG. 7 shows an overall flow chart for a method to generate a synchronous signal stream according to one embodiment of the present invention.

FIG. 7 shows an overall flow chart for a method to generate a synchronous signal stream according to one embodiment of the present invention. Operation 701 detects transition edges (e.g. a rising edge, a falling edge, or both) of a Low Frequency (LF) digital signal; and operation 703 generates a pulse corresponding to each of the detected transition edges such that the pulse has a predetermined width and at least one of the transition edges of the pulse is substantially synchronized with an transition edge of a High Frequency (HF) digital signal. Transition edges of the LF digital signal can be detected from first generating an intermediate signal by adjusting the timing of the transition edges of the LF signal to synchronize with the transition edges of the HF signal; and then detecting transition edges from the intermediate signal (e.g., from comparing the intermediate signal with a delayed version of the intermediate signal).

Figure 8:
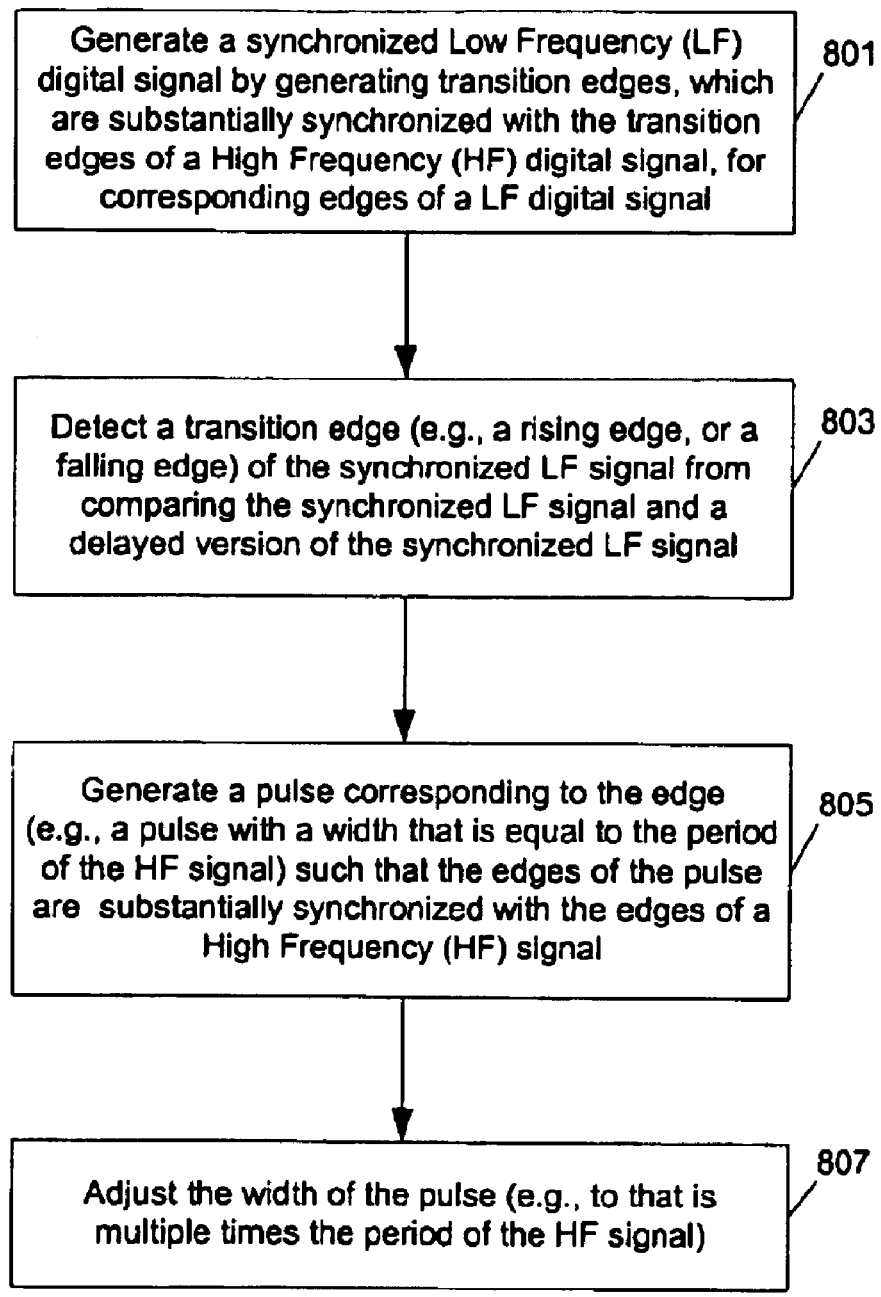
FIG. 8 shows a detailed flow chart for a method to generate a synchronous signal stream according to one embodiment of the present invention.

FIG. 8 shows a detailed flow chart for a method to generate a synchronous signal stream according to one embodiment of the present invention. Operation 801 generates a synchronized Low Frequency (LF) digital signal by generating transition edges, which are substantially synchronized with the transition edges of a High Frequency (HF) digital signal, for corresponding edges of a LF digital signal. Operation 803 detects a transition edge (e.g., a rising edge, or a falling edge) of the synchronized LF signal from comparing the synchronized LF signal and a delayed version of the synchronized LF signal. Operation 805 generates a pulse corresponding to the edge (e.g., a pulse with a width that is equal to the period of the HF signal) such that the edges of the pulse are substantially synchronized with the edges of a High Frequency (HF) signal. Operation 807 adjusts the width of the pulse (e.g., to that is multiple times the period of the HF signal). In generating a timebase enable signal, an independent reference signal of a proper frequency can be used as the LF digital signal; and a synchronized system signal (e.g., a bus clock signal) can be used as the HF digital signal.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method to generate a digital output signal stream from two digital input signal streams, the method comprising:

detecting a first transition edge in a first digital input signal stream;

generating a third transition edge in a digital output signal stream, the third transition edge corresponding to the first transition edge, the third transition edge being synchronized substantially with a second transition edge in a second digital input signal stream; and generating a third digital signal stream from synchronizing substantially transition edges of the first digital input signal stream with transition edges of the second digital input signal streams;

wherein the first transition edge is detected using the third digital signal stream.

2. A method as in claimed 1 wherein said detecting the first transition edge comprises:

comparing the third digital signal stream with a delayed version of the third digital signal stream.

3. A frequency convertor for generating a digital output signal stream from two digital input signal streams, the frequency convertor comprising:

an edge detector, the edge detector detecting a first transition edge in a first digital input signal stream;

an output pulse generator coupled to the edge detector, the output pulse generator generating a third transition edge in a digital output signal stream, the third transition edge corresponding to the first transition edge, the third transition edge being synchronized substantially with a second transition edge in a second digital input signal stream received in the output pulse generator; and an input synchronizer coupled to the edge detector, the input synchronizer generating a third digital signal stream from synchronizing substantially transition edges of the first digital input signal stream with transition edges of the second digital input signal streams, and the edge detector detecting the first transition edge using the third digital signal stream.

4. A frequency convertor as in claim 3 wherein the edge detector compares the third digital signal stream with a delayed version of the third digital signal stream to detect the first transition edge.

5. A machine readable medium containing executable computer program instructions which when executed by a digital processing system cause said system to perform a method to generate a digital output signal stream from two digital input signal streams, the method comprises:

detecting a first transition edge in a first digital input signal stream;

generating a third transition edge in a digital output signal stream, the third transition edge corresponding to the first transition edge, the third transition edge being synchronized substantially with a second transition edge in a second digital input signal stream; and generating a third digital signal stream from synchronizing substantially transition edges of the first digital input signal stream with transition edges of the second digital input signal streams;

wherein the first transition edge is detected using the third digital signal stream.

6. A medium as in claim 5 wherein said detecting the first transition edge comprises:

comparing the third digital signal stream with a delayed version of the third digital signal stream.

7. A digital processing system to generate a digital output signal stream from two digital input signal streams, the digital processing system comprising:

means for detecting a first transition edge in a first digital input signal stream;

means for generating a third transition edge in a digital output signal stream, the third transition edge corresponding to the first transition edge, the third transition edge being synchronized substantially with a second transition edge in a second digital input signal stream received in said means for generating; and means for generating a third digital signal stream from synchronizing substantially transition edges of the first digital input signal stream with transition edges of the second digital input signal streams;

wherein the first transition edge is detected using the third digital signal stream.

8. A digital processing system as in claim 7 wherein said means for detecting the first transition edge comprises:
   means for comparing the third digital signal stream with a delayed version of the third digital signal stream.

9. A frequency convertor for generating a digital output signal stream from two digital input signal streams, the frequency convertor comprising:
   an input synchronizer, the input synchronizer to generate a third digital signal stream from synchronizing substantially transition edges of a first digital input signal stream with transition edges of a second digital input signal streams; and
   an edge detector coupled to the input synchronizer, the edge detector to detect a first transition edge in the first digital input signal stream using the third digital signal stream.

10. The frequency convertor of claim 9 further comprising:
   an output pulse generator coupled to the edge detector, the output pulse generator generating a third transition edge in a digital output signal stream according to the first transition edge and the second digital input signal stream, the third transition edge corresponding to the first transition edge, the third transition edge being synchronized substantially with a second transition edge in the second digital input signal stream.

11. The frequency convertor of claim 10, wherein the edge detector compares the third digital signal stream with a delayed version of the third digital signal stream to detect the first transition edge.

12. The frequency convertor of claim 11, wherein the edge detector generates a pulse corresponding to the first transition edge from comparing the third digital signal stream with the delayed version of the third digital signal stream.

13. A method to generate a digital output signal stream from two digital input signal streams, the method comprising:
   generating a third digital signal stream from synchronizing substantially transition edges of a first digital input signal stream with transition edges of a second digital input signal streams; and
   detecting a first transition edge in the first digital input signal stream using the third digital signal stream.

14. The method of claim 13, further comprising:
   generating a third transition edge in a digital output signal stream, the third transition edge corresponding to the first transition edge, the third transition edge being synchronized substantially with a second transition edge in the second digital input signal stream.

15. The method of claim 13, wherein said detecting the first transition edge comprises:
   comparing the third digital signal stream with a delayed version of the third digital signal stream.

16. The method of claim 15, wherein a pulse corresponding to the first transition edge is generated from comparing the third digital signal stream with the delayed version of the third digital signal stream.

17. A machine readable medium containing executable computer program instructions which when executed by a digital processing system cause said system to perform a method to generate a digital output signal stream from two digital input signal streams, the method comprising:
   generating a third digital signal stream from synchronizing substantially transition edges of a first digital input signal stream with transition edges of a second digital input signal streams; and
   detecting a first transition edge in the first digital input signal stream using the third digital signal stream.

18. The medium of claim 17, wherein the method further comprises:
   generating a third transition edge in a digital output signal stream, the third transition edge corresponding to the first transition edge, the third transition edge being synchronized substantially with a second transition edge in the second digital input signal stream.

19. The medium of claim 18, wherein said detecting the first transition edge comprises:
   comparing the third digital signal stream with a delayed version of the third digital signal stream.

20. The medium of claim 19, wherein a pulse corresponding to the first transition edge is generated from comparing the third digital signal stream with the delayed version of the third digital signal stream.

21. A digital processing system to generate a digital output signal stream from two digital input signal streams, the digital processing system comprising:
   means for generating a third digital signal stream from synchronizing substantially transition edges of a first digital input signal stream with transition edges of a second digital input signal streams; and
   means for detecting a first transition edge in the first digital input signal stream using the third digital signal stream.

22. The digital processing system of claim 21, further comprising:
   means for generating a third transition edge in a digital output signal stream according to the first transition edge and the second digital input signal stream, the third transition edge corresponding to the first transition edge, the third transition edge being synchronized substantially with a second transition edge in the second digital input signal stream.

23. The digital processing system of claim 22, wherein said means for detecting the first transition edge comprises:
   means for comparing the third digital signal stream with a delayed version of the third digital signal stream.

24. The digital processing system of claim 23, wherein a pulse corresponding to the first transition edge is generated from comparing the third digital signal stream with the delayed version of the third digital signal stream.

* * * * *